(12) United States Patent
Ahn (10) Patent No.: US 8,264,224 B2
(45) Date of Patent: Sep. 11, 2012

(54) DETECTION OF MAGNETIC FIELDS USING NANO-MAGNETS

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 303 days.

(21) Appl. No.: 12/606,852

(22) Filed: Oct. 27, 2009

(65) Prior Publication Data

US 2011/0095761 A1   Apr. 28, 2011

(51) Int. Cl.
*G01V 3/00*   (2006.01)

(52) U.S. Cl. ........................................ 324/309

(58) Field of Classification Search ........... 324/300–322
See application file for complete search history.

(56) References Cited

U.S. PATENT DOCUMENTS

| | | | |
|---|---|---|---|
| 3,435,342 | A | 3/1969 | Burnsweig et al. |
| 3,439,349 | A | 4/1969 | Raillard et al. |
| 6,798,200 | B2 | 9/2004 | Fan |
| 6,798,202 | B2 | 9/2004 | Savelainen |
| 7,719,280 | B2 | 5/2010 | Lagae et al. |
| 8,164,333 | B2 | 4/2012 | Rugar et al. |
| 2005/0244337 | A1 | 11/2005 | Wang et al. |
| 2005/0261763 | A1 | 11/2005 | Wang et al. |
| 2005/0278020 | A1 | 12/2005 | Wang et al. |
| 2006/0269479 | A1 | 11/2006 | Colton et al. |
| 2007/0027532 | A1 | 2/2007 | Wang et al. |
| 2008/0221430 | A1 | 9/2008 | Ochi et al. |
| 2008/0252293 | A1 | 10/2008 | Lagae et al. |
| 2010/0121420 | A1 | 5/2010 | Fiset et al. |
| 2010/0301854 | A1 | 12/2010 | Rugar et al. |
| 2011/0003279 | A1 | 1/2011 | Patel |
| 2011/0062957 | A1 | 3/2011 | Fu et al. |
| 2011/0117202 | A1 | 5/2011 | Bourke, Jr. et al. |
| 2011/0144478 | A1 | 6/2011 | Zabow et al. |
| 2012/0065494 | A1 | 3/2012 | Gertner et al. |

FOREIGN PATENT DOCUMENTS

| | | |
|---|---|---|
| WO | 2007/117604 A2 | 10/2007 |
| WO | 2007/118261 | 10/2007 |
| WO | WO 2011093627 | 8/2011 |

OTHER PUBLICATIONS

U.S. Appl. No. 12/696,652, filed Jan. 29, 2010, Ahn.
Wai-Fung Cheong et al., "A Review of the Optical Properties of Biological Tissues", IEEE Journal of Quantum Electronics, Dec. 1990, vol. 26. No. 12, 1990 IEEE, pp. 2166-2185.
Avraham Lorber et al., "Net Analyte Signal Calculation in Multivariate Calibration", Analytical Chemistry, Apr. 15, 1997, vol. 69, No. 8, 1620-1626, 1997 American Chemical Society.
Michael R. Cohen et al., "Diffuse Reflectance Measurements of Standard Diffusers", [online: http://www.4physics.com/tn3/lambertian.htm].
Lisette D'Souza et al., "Diffuse reflectance infrared fourier transform spectroscopic (DRIFTS) investigation of *E. coli*, *Staphylococcus aureus* and *Candida albicans*", Indian Journal of Marine Sciences, Mar. 2009, vol. 38(1), pp. 45-51.

(Continued)

*Primary Examiner* — Dixomara Vargas
(74) *Attorney, Agent, or Firm* — Workman Nydegger (57) ABSTRACT

Magnetic field detection techniques and devices are provided. In one embodiment, a device configured to detect a magnetic field includes a first set of nano-magnets and a second set of nano-magnets. The first set of nano-magnets is operable to induce a RF magnetic field, and the second set of nano-magnets is operable to induce a first electrical signal in response to magnetic resonance signals caused by the RF magnetic field.

17 Claims, 4 Drawing Sheets

OTHER PUBLICATIONS

Carl H. Smith et al., "Chip-Size Magnetic Sensor Arrays", prepared for Sensors EXPO May 21, 2002.
International Search Report and Written Opinion from International Application No. PCT/KR2011/000496 dated Apr. 28, 2011.
J.B. Pendry "Negative Refraction Makes a Perfect Lens" Physical Review Letters, vol. 85, No. 18, Oct. 30, 2000 pp. 3966-3969.
Hyung Kwon Kim, et al "Faraday's Induction Experiment in Nano-Transformers" IEEE Transactions on Nanotechnology, vol. 7, No. 2, Mar. 2008 pp. 120-123.
D.R. Smith, et al "Composite Medium with Simultaneously Negative Permeability and Permittivity" Physical Review Letters, vol. 81, No. 18, May 1, 2000, pp. 4184-4187.
R. P. Cowburn, et al "Sensing magnetic fields using superparamagnetic nanomagnets" J. Appl. Phys. 87, 7082 (2000).
S. Chao, et al "Nanometer-scale magnetic resonance imaging" Rev. Sci. Instrum. 75, 1175 (2004).
M. Barbic, et al "Magnetic nanostructures as amplifiers of transverse fields in magnetic resonance", Solid State Nuclear Magnetic Resonance, vol. 28, Issues 2-4, Sep. 2005, pp. 91-105, Special issue in honor of Prof. Jerzy Blicharski.
Australian Patent Office; International Search Report and Written Opinion in corresponding PCT application (PCT/KR2010/007293); mailed Jan. 31, 2011.
U.S. Appl. No. 12/696,652, mail date Nov. 16, 2011, Notice of Allowance.
U.S. Appl. No. 12/696,652, mail date Jan. 27, 2012, Notice of Allowance.
Cartwright, J., "Metamaterials boost MRI sensitivity," accessed at http://physicsworld.com/cws/article/news/36237, 2 Pages, Oct. 15, 2008.
U.S. Appl. No. 12/696,652, mail date May 21, 2012, Notice of Allowance.

DETECTION OF MAGNETIC FIELDS USING NANO-MAGNETS

CROSS REFERENCE TO RELATED APPLICATION

This application is related to U.S. patent application Ser. No. 12/696,652 filed Jan. 29, 2010.

BACKGROUND

Magnetic Resonance Imaging (MRI) is primarily a medical imaging technique commonly used in radiology to visualize the internal structure and function of a body. MRI includes a magnet, such as 'C' shaped permanent magnet, resistive electromagnet and cylindrical superconducting electromagnet. Such magnet generates a powerful magnetic field to align the nuclear magnetization of hydrogen atoms in water in the body. Radio frequency (RF) field is used to systematically alter the alignment of this magnetization, causing the hydrogen nuclei to produce rotating magnetic field signals detectable by a scanner or a detector. These signals can be manipulated by additional magnetic fields to build up enough information to construct an image of the body. Because clinical magnets generally have a field strength, such as, in the range of 0.2-3.0 tesla (T) and a large swiss roll shape, the conventional MM is neither portable nor cost effective.

SUMMARY

In one embodiment, a device for detecting magnetic field is provided. The device includes a first set of nano-magnets and a second set of nano-magnets. The first set of nano-magnets is operable to induce a RF magnetic field, and the second set of nano-magnets is operable to induce a first electrical signal in response to magnetic resonance signals caused by the RF magnetic field.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In one embodiment, a device for detecting magnetic field is provided. The device includes a first set of nano-magnets and a second set of nano-magnets. The first set of nano-magnets is operable to induce a RF magnetic field, and the second set of nano-magnets is operable to induce a first electrical signal in response to a magnetic resonance signal caused by the RF magnetic field. The device can further include a detector configured to detect the first electrical signal, and a source configured to apply a second electrical signal to the first set of nano-magnets. The first set of nano-magnets and the second set of nano-magnets can be arranged in a two-dimensional array. The RF magnetic field may excite spins of a target disposed between the first set of nano-magnets and the second set of nano-magnets. The magnetic resonance signal may be generated in response to the excited spins. Materials for each nano-magnet of the first and second sets may include ferromagnetic metals, transition metals, or single-molecule magnets.

The device can further include a negative refractive index medium operable to convert the magnetic resonance signal into a sub-wavelength focused magnetic field signal. The negative refractive index medium may be positioned between the first and second sets of nano-magnets. The second set of nano-magnets may be operable to induce the first electrical signal in response to the sub-wavelength focused magnetic field signal. The RF magnetic field may excite spins of a target disposed between the first set of nano-magnets and the negative refractive index medium. Then the magnetic resonance signal may be generated in response to the excited spins of the target.

In another embodiment, a magnetic resonance imaging ("MRI") device is provided. The MM device includes the illustrative device, a detector configured to detect the first electrical signal, a source configured to apply a second electrical signal to the first set of nano-magnets, a controller, and a data processing unit. The controller is coupled to the source and a data processing unit and is configured to instruct the source to apply the second electrical signal to the first set of nano-magnets and the data processing unit to collect data related to the first electrical signal. The data processing unit is configured to create images for display based on the collected data.

The MRI device can further include a negative refractive index medium configured to convert the magnetic resonance signal into sub-wavelength focused magnetic field signal. The negative refractive index medium may be positioned between the first and second sets of nano-magnets. The second set of nano-magnets may be operable to induce the first electrical signal in response to the sub-wavelength focused magnetic field signal. The RF magnetic field may excite spins of a target disposed between the first set of nano-magnets and the second set of nano-magnets. The magnetic resonance signal may be generated in response to the excited spins.

Further, the RF magnetic field can be between approximately 0.2 and 3 Tesla, and the spins of the target can be resonant at a frequency between approximately 8.5 and 128 MHz.

In another embodiment, a method for detecting magnetic field is provided. The method includes generating a RF magnetic field from a first set of nano-magnets, exciting spins of a target based on the RF magnetic field, generating a magnetic resonance signal from the excited spins of the target, and inducing a first electrical signal based on the magnetic resonance signal at a second set of nano-magnets. The RF magnetic field can be generated by applying a second electrical signal to the first set of nano-magnets, and inducing the RF magnetic field based on the second electrical signal at the first set of nano-magnets.

The method can further include converting the magnetic resonance signal into a sub-wavelength focused magnetic field signal prior to inducing the first electrical signal. In this case, the first electrical signal may be induced based on the sub-wavelength focused magnetic field signal.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Figure 1:
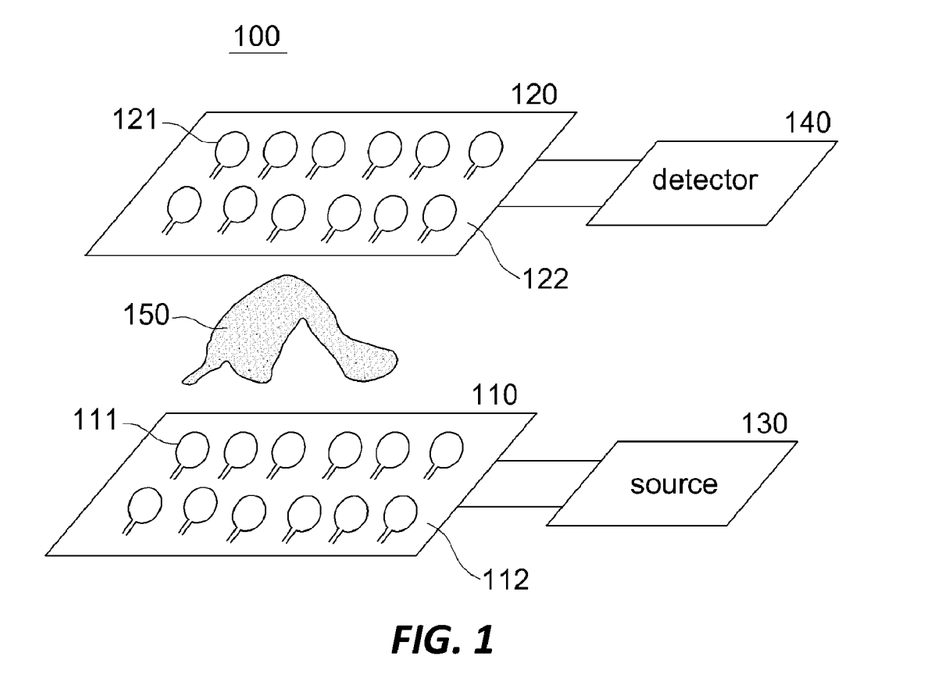
FIG. 1 shows a schematic diagram of an illustrative embodiment of a magnetic field detection device.

FIG. 1 shows a schematic diagram of an illustrative embodiment of a magnetic field detection device. As depicted, a device 100 includes a first set of nano-magnets 110 and a second set of nano-magnets 120 facing first set of nano-magnets 110. In some embodiments, first set of nano-magnets 110 and second set of nano-magnets 120 are positioned apart from each other so that a target 150 can be disposed therebetween. Examples of target 150 include any organism, such as a human body, an animal, a plant, or any inorganic substance. The distance between first and second sets of nano-magnets 110 and 120 can be controlled to allow target 150 to be disposed between first and second sets of nano-magnets 110 and 120.

With reference to FIG. 1, first and second sets of nano-magnets 110 and 120 includes substrates 112 and 122, respectively, and multiple numbers of nano-magnets 111 and 121 respectively arranged on substrates 112 and 122. In some embodiments, nano-magnets 111 and 121 may be arranged in a two-dimensional array on substrates 112 and 122, respectively. For example, as depicted in FIG. 1, the multiple numbers of nano-magnets 111 and 121 can be arranged in two rows on substrate 112 and 122, respectively. The number or arrangement of nano-magnets 111 and 121 can be determined based on the size and shape of target 150.

Materials for nano-magnets 111 and 121 can include ferromagnetic metals, transition metals, or single-molecule magnets. For example, materials for nano-magnets 111 and 121 may include, without limitation, Ti/Au, Ti/Pt, Cr/Au, Cr/Pt, CoFe, NiFe, Co, Ni, or Fe. Nano-magnets 111 and 121 may be arranged in any configuration on substrate 112, without limitation, to induce a magnetic field in the vertical direction of substrate 112. Nano-magnets 121 may be arranged in any configuration on substrate 122, without limitation, to receive a magnetic resonance signal from target 150 in the vertical direction of substrate 122. The magnetic resonance signal is generated from target 150 in response to the magnetic field, which will be further explained hereinafter.

In some embodiments, nano-magnets 111 and 121 can be concentric as shown in FIG. 1. Concentric nano-magnet 111 and 121 can have nano-sized radii of, for example, about 500 nm to 2000 nm, or about 700 nm to 1400 nm. Concentric nano-magnet 111 and 121 can have nano-sized widths of, for example, about 50 nm to 500 nm, or about 200 nm to 500 nm. Nano-magnets 111 and 121 can be fabricated by electron beam lithography and lift-off process on substrates 112 and 122, respectively. Particularly, nano-magnets 111 and 121 can be fabricated by depositing a base metal layer for nano-magnets 111 and 121 on substrates 112 and 122, respectively, using any of variety of well-known metal deposition techniques, such as sputtering, electroplating, e-beam evaporation, thermal evaporation, laser-induced evaporation, and ion-beam induced evaporation, and selectively removing the base metal layer to form nano-magnets 111 and 121 having a ring-type metal loop using the lift-off process. Herein, the term "lift-off process" refers to the process of creating structures of a target material on the surface of a substrate using a sacrificial material. By way of example, substrates 112 and 122 may have a substantially rectangular or square shape, and be comprised of, for example, Si/SiO2. The base metal layer can be composed of Ti/Au, Ti/Pt, Cr/Au, Cr/Pt, CoFe, NiFe, Co, Ni, or Fe.

In some embodiments, nano-magnets 111 of first set of nano-magnets 110 is operable to induce a RF magnetic field in response to a time-varying electric field, which may exist around first set of nano-magnets 110. By way of example, first set of nano-magnets 110 may be placed in an area near or surrounded with electrically charged objects or a power transmitter wirelessly transmitting an electric power. In another embodiment, the electric field may be provided from an external device. By way of example, a source 130 may be operably, for example, electrically coupled to first set of nano-magnets 110 to apply a second electrical signal to first set of nano-magnets 110. By ways of example, source 130 may include a power source to apply the second electrical signal (for example, an AC current) to first substrate 112 of first set of nano-magnets 110 such that nano-magnets 111 positioned on first substrate 112 induce the RF magnetic field.

The induced RF magnetic field can be used to excite spins of target 150. Assuming that target 150 is a human body interposed between first and second sets of nano-magnets 110 and 120, an alignment of a nuclear magnetization of hydrogen atoms in water contained in the body can be systematically altered in response to the induced RF magnetic field. As used herein, the term "spins of target 150" refers to the systematical alternation of the alignment of the nuclear magnetization of hydrogen atoms in water contained in target 150. Accordingly, the RF magnetic field can excite the spins of target 150 interposed between first set of nano-magnets 110 and second set of nano-magnets 120. The excitation of the spins of target 150 can generate a magnetic resonance signal.

In response to the magnetic resonance signal generated from the excited spins of target 150, an AC voltage is induced at nano-magnets 121 of second set of nano-magnets 120 based on Faraday's law of induction, and thus an AC current flows through nano-magnets 121 of second set of nano-magnets 120. Accordingly, the magnetic resonance signal can be detected as a first electrical signal, such as a voltage signal or a current signal, through second set of nano-magnets 120, which will be described hereinafter.

In some embodiments, device 100 may optionally include a detector 140 to detect the magnetic resonance signal. Detector 140 may be operably, for example, electrically coupled to second set of nano-magnets 120. By ways of examples, detector 140 may include a current detector or a voltage detector. In some embodiment, detector 140 may be electrically coupled to second substrate 122 of second set of nano-magnets 120 and detect the magnetic resonance signal as a first electrical signal induced from nano-magnets 121 positioned on second substrate 122 of second set of nano-magnets 120. For another example, detector 140 may be coupled to nano-magnets 121 to detect the first electrical signal from nano-magnets 121.

Figure 2:
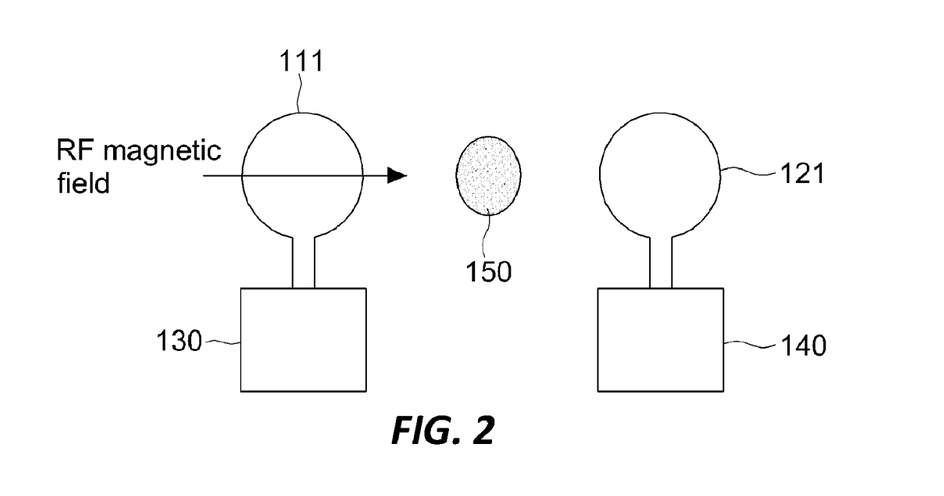
FIG. 2 shows a schematic diagram of the device of FIG. 1 illustrating detection of a magnetic field in accordance with one example.
Figure 3:
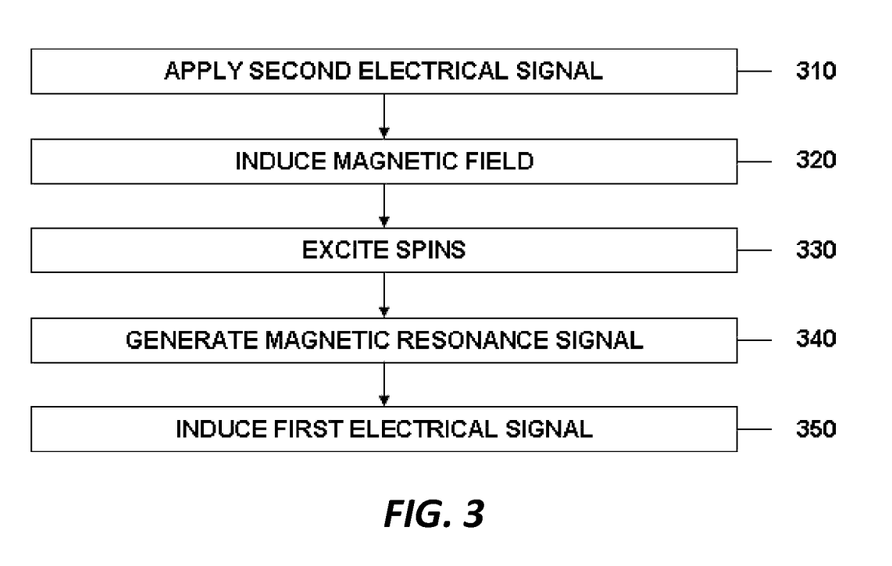
FIG. 3 is a flowchart of an illustrative embodiment of the method for detecting a magnetic field shown in FIG. 2.

With reference to FIGS. 2 and 3, a method for detecting a magnetic field in accordance with one example is described hereinafter. FIG. 2 shows a schematic diagram of the device of FIG. 1 illustrating detection of a magnetic field in accordance with one example. FIG. 3 is a flowchart of an illustrative embodiment of the method for detecting a magnetic field shown in FIG. 2. As illustrated above with respect to FIG. 1, the second electric signal, such as an AC current is supplied from source 130 to nano-magnets 111 of first set of nano-magnets 110 (Step 310). A time-varying magnetic flux (that is RF magnetic field) is induced from the AC current through nano-magnets 111 of first set of nano-magnets 110 (Step 320) based on Faraday's law of induction.

In one example, the RF magnetic field can be between approximately 0.2 and 3 Tesla and cause nuclear spins of target 150 to align and to be resonant at the local Larmor frequency between approximately 8.5 and 128 MHz. The nuclear spins are excited and precess around an axis along the direction (as depicted by the arrow in FIG. 2) of the RF magnetic field (Step 330). A magnetic resonance signal is generated from the excited spins (Step 340). Nano-magnets 121 coupled to detector 140 induce the first electrical signal based on the magnetic resonance signal from target 150 (Step 350). The induction of the first electrical signal is based on Faraday's law of induction.

Figure 4:
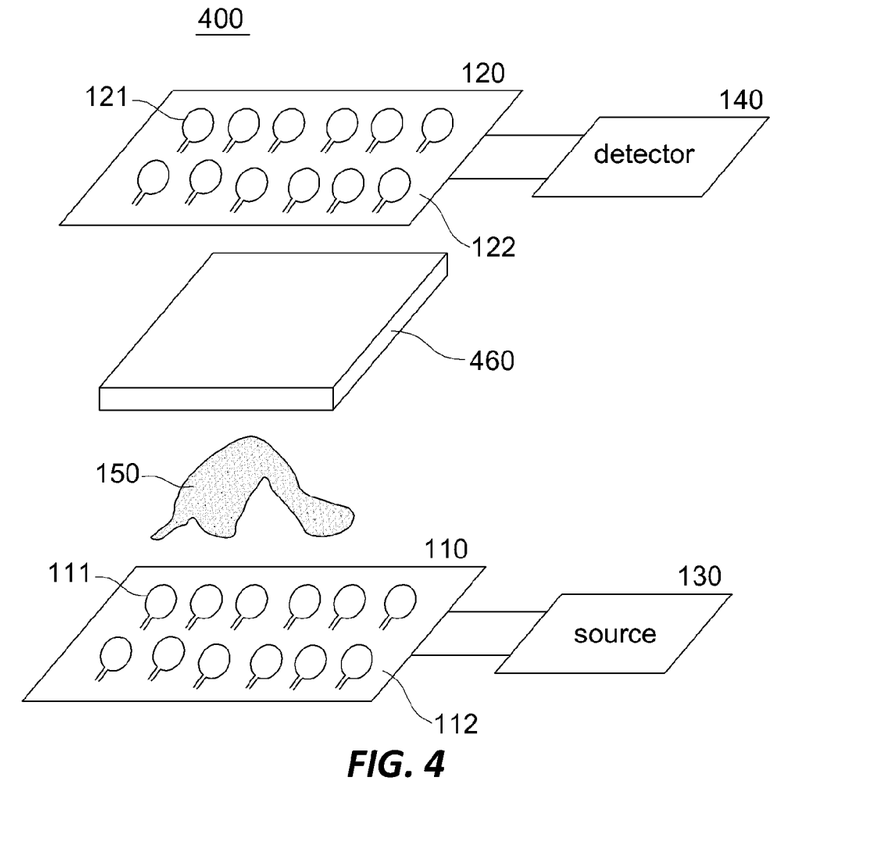
FIG. 4 shows a schematic diagram of another illustrative embodiment of a magnetic field detection device.

FIG. 4 shows a schematic diagram of another illustrative embodiment of a device for detecting magnetic field. A device 400 has the same constitutions as those shown in FIG. 1 except that device 400 has a negative refractive index medium 460 interposed between first set of nano-magnets 110 and second set of nano-magnets 120. Negative refractive index medium 460 may include any material which features negative refractive properties. For example, metamaterial can be used as negative refractive index medium 460. Here, the term "metamaterial" is narrowly used in the electromagnetics fields to refer to materials exhibiting negative refraction.

Negative refractive index medium 460 can convert an incident magnetic resonance signal into a sub-wavelength focused magnetic field signal. Here, the term "incident magnetic resonance signal" refers to the magnetic resonance signal generated from target 150 as described above. The term "sub-wavelength" is used to describe an object having one or more dimensions smaller than the wavelength of a wave with which the object interacts. For example, a sub-wavelength particle is a particle smaller than the wavelength of light with which it interacts.

When an electromagnetic wave is transmitted from a material with an index of refraction $n_1$ to another material with refraction $n_2$, with an incident angle $\theta_1$, a transmitted angle $\theta_2$ of a transmitted wave is determined by the Snell's law of refraction: $n_1 \sin \theta_1 = n_2 \sin \theta_2$. When $n_2$ is negative, the transmitted angle $\theta_2$ and the incident angle $\theta_1$ are of opposite signs. Since the index of negative refractive index medium 460 is negative, an incident angle and a transmitted angle of negative refractive index medium 460 are of opposite signs. Herein, the term, "incident angle" refers to an angle between an electromagnetic wave incident on a surface and a line perpendicular to the surface at a point of incidence. The term, "transmitted angle" is also called as "angle of refraction," and refers to an angle formed by a refracted electromagnetic wave and a line perpendicular to a refracting surface at a point of refraction. Thus, the magnetic resonance signal from target 150 through negative refractive index medium 460 can be focused onto an area having dimensions smaller than a square wavelength. Thus, a size of first and second sets of nano-magnets 110 and 120 can be reduced because the magnetic resonance signal which has passed though negative refractive index medium 460 is focused on a certain area of substrate 122, which is smaller than the area of negative refractive index medium 460 on which the incident magnetic resonance signal is arrived.

Figure 5:
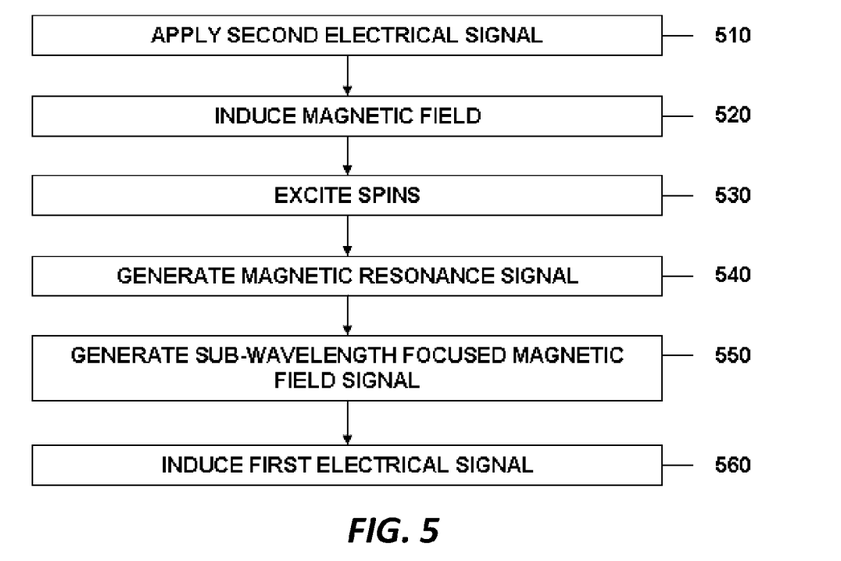
FIG. 5 is a flowchart of another illustrative embodiment of a method for detecting a magnetic field.

FIG. 5 is a flowchart of the illustrative embodiment of the method for detecting magnetic field of FIG. 4. The second electrical signal is applied from source 300 to first set of nano-magnets 110 (step 510). First set of nano-magnets 110 induces RF magnetic field based on the applied electrical signal (step 520). The induced RF magnetic field excites spins of target 150 (step 530), and a magnetic resonance signal is generated based on the spin excitation (step 540). The magnetic resonance signal is converted into a sub-wavelength focused magnetic field signal through negative refractive index medium 460 (step 550). The sub-wavelength focused magnetic field signal is applied to second set of nano-magnets 120, which induces the first electrical signal based on the sub-wavelength focused magnetic field signal (step 560).

Figure 6:
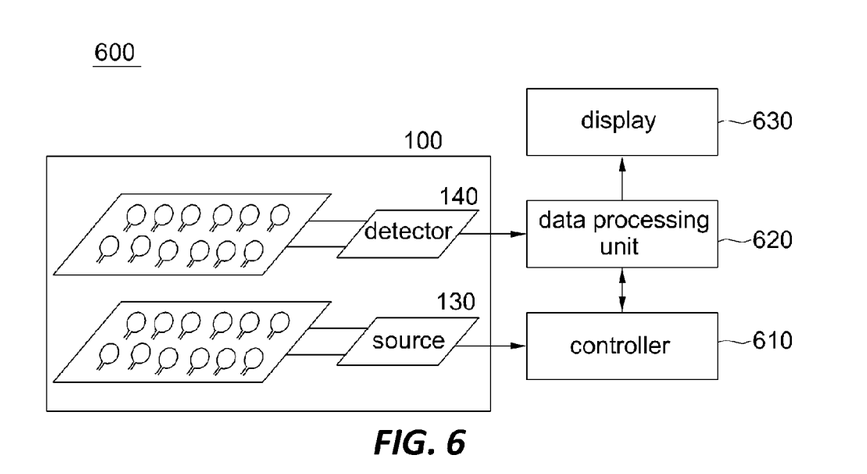
FIG. 6 shows a schematic diagram of an illustrative embodiment of an MRI device.

FIG. 6 shows a schematic diagram of an illustrative embodiment of a magnetic resonance imaging ("MRI") device. An MRI device 600 includes device to detect a magnetic field 100, a controller 610, and a data processing unit 620. Device 100 has the same configurations as depicted in FIG. 1. That is, device 100 includes first and second sets of nano-magnets 110 and 120 facing each other, source 130 to apply the second electric signal to first set of nano-magnets 110, and detector 140 to detect the first electric signal induced by second set of nano-magnets 120. In some embodiments, MRI device 600 may include device 400 to detect a magnetic field, instead of device 100. In such a case, device 400 may further include negative refractive index medium 460 placed or positioned between first and second sets of nano-magnets 110 and 120.

Controller 610 is configured to control both device 100 and data processing unit 620. Controller 610 instructs source 130 to apply the second electrical signal to first set of nano-magnets 110. Controller 610 instructs data processing unit 620 to collect data, for example, phase and/or frequency data from a first electrical signal from detector 140. Data processing unit 620 is configured to associate with controller 610. Data processing unit 620 collects data from detector 140 of device 100 and generates and outputs images for display based on the collected data. In some embodiments, MRI device 600 can optionally include a display 630 configured to display the images from data processing unit 620. For example, display 630 includes a screen, such as LCD display, and is configured to display the output images generated from data processing unit 620 on the screen.

In some embodiment, MRI device 600 can be used as a health monitoring device. In some embodiments, MRI device 600 examines a target (for example, an organ or a tissue of the target) by receiving an electrical signal (for example, a second electrical signal from source 130 in FIG. 1) to excite spins of the target, and detecting an electrical signal (for example, the first electrical signal detected by detector 140 in FIG. 1) generated in response to a magnetic resonance signal caused by the excited spins. Since MM device 600 can be configured as a hand-held portable MRI device, a small size of target, such as a part of a body (for example, a human finger) can be easily examined at any place.

As described above, a magnetic resonance signal can be easily detected in devices 100 and 400, and MRI device 600 by applying an electric signal between first and second sets of nano-magnets which are relatively small and simply manufactured. Further, the simple and small configuration of devices 100, and 400 allow MRI device 600 to be compact and portable. Thus, a certain small part of a target can be examined using MRI 600 conveniently at home as well as a hospital.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A device for detecting a magnetic field comprising:
   a first set of nano-magnets operable to induce a radio frequency (RF) magnetic field in response to a time-varying electric field;
   a second set of nano-magnets operable to induce a first electrical signal in response to a magnetic resonance signal caused by the RF magnetic field;
   a source configured to provide the time-varying electric field by applying a second electrical signal to the first set of nano-magnets; and a detector configured to detect the first electrical signal.

2. The device of claim 1, wherein the first set of nano-magnets and the second set of nano-magnets are arranged in a two-dimensional array.

3. The device of claim 1, wherein the RF magnetic field excites spins of a target disposed between the first set of nano-magnets and the second set of nano-magnets, and wherein the magnetic resonance signal is generated in response to the excited spins.

4. The device of claim 1, wherein each nano-magnet of the first and second sets comprises a material selected from the group consisting of ferromagnetic metals, transition metals, and single-molecule magnets.

5. The device of claim 1, further comprising:
a negative refractive index medium positioned between the first and second sets of nano-magnets and operable to convert the magnetic resonance signal into a sub-wavelength focused magnetic field signal,
wherein the second set of nano-magnets is operable to induce the first electrical signal in response to the sub-wavelength focused magnetic field signal.

6. The device of claim 5, wherein the RF magnetic field excites spins of a target disposed between the first set of nano-magnets and the negative refractive index medium, and wherein the magnetic resonance signal is generated in response to the excited spins of the target.

7. A magnetic resonance imaging ("MRI") device comprising:
a first set of nano-magnets operable to induce a radio frequency (RF) magnetic field in response to a time-varying electric field;
a second set of nano-magnets operable to induce a first electrical signal in response to a magnetic resonance signal caused by the RF magnetic field;
a detector configured to detect the first electrical signal;
a source configured to provide the time-varying electric field by applying a second electrical signal to the first set of nano-magnets;
a controller, coupled to both the source and a data processing unit, configured to instruct the source to apply the second electrical signal to the first set of nano-magnets and the data processing unit to collect data related to the first electrical signal; and
the data processing unit configured to create images for display based on the collected data.

8. The MRI device of claim 7, further comprising:
a negative refractive index medium that is positioned between the first and second sets of nano-magnets and configured to convert the magnetic resonance signal into a sub-wavelength focused magnetic field signal,
wherein the second set of nano-magnets is operable to induce the first electrical signal in response to the sub-wavelength focused magnetic field signal.

9. The MRI device of claim 8, wherein the RF magnetic field excites spins of a target disposed between the first set of nano-magnets and the negative refractive index medium, and wherein the magnetic resonance signal is generated in response to the excited spins of the target.

10. The MRI device of claim 9, wherein the spins of the target are resonant at a frequency between approximately 8.5 and 128 MHz.

11. The MRI device of claim 8, wherein the RF magnetic field is between approximately 0.2 and 3 Tesla.

12. The MRI device of claim 7, wherein the RF magnetic field excites spins of a target disposed between the first set of nano-magnets and the second set of nano-magnets, and wherein the magnetic resonance signal is generated in response to the excited spins.

13. The MRI device of claim 12, wherein the spins of the target are resonant at a frequency between approximately 8.5 and 128 MHz.

14. The MRI device of claim 7, wherein the RF magnetic field is between approximately 0.2 and 3 Tesla.

15. A method for detecting magnetic field comprising:
generating a RF magnetic field from a first set of nano-magnets in response to a time varying electric field;
exciting spins of a target based on the RF magnetic field;
generating a magnetic resonance signal from the excited spins of the target;
inducing a first electrical signal based on the magnetic resonance signal at a second set of nano-magnets and detecting the first induced electrical signal.

16. The method of claim 15, wherein the generating RF magnetic field comprises applying a second electrical signal to the first set of nano-magnets and inducing the RF magnetic field based on the second electrical signal at the first set of nano-magnets.

17. The method of claim 15 further comprising:
converting the magnetic resonance signal into a sub-wavelength focused magnetic field signal prior to inducing the first electrical signal,
wherein inducing the first electrical signal is performed based on the sub-wavelength focused magnetic field signal.

* * * * *

UNITED STATES PATENT AND TRADEMARK OFFICE
CERTIFICATE OF CORRECTION

PATENT NO. : 8,264,224 B2  
APPLICATION NO. : 12/606852  
DATED : September 11, 2012  
INVENTOR(S) : Ahn Page 1 of 1

It is certified that error appears in the above-identified patent and that said Letters Patent is hereby corrected as shown below:

On Title Page 2, Item (56), under "OTHER PUBLICATIONS", in Column 1, Line 7, delete "et al" and insert -- et al. --, therefor.

On Title Page 2, Item (56), under "OTHER PUBLICATIONS", in Column 1, Line 10, delete "et al" and insert -- et al. --, therefor.

On Title Page 2, Item (56), under "OTHER PUBLICATIONS", in Column 1, Line 16, delete "et al" and insert -- et al. --, therefor.

On Title Page 2, Item (56), under "OTHER PUBLICATIONS", in Column 1, Line 18, delete "et al" and insert -- et al. --, therefor.

On Title Page 2, Item (56), under "OTHER PUBLICATIONS", in Column 2, Line 1, delete "et al" and insert -- et al. --, therefor.

In Column 1, Line 27, delete "MM" and insert -- MRI --, therefor.

In Column 2, Line 28, delete "MM" and insert -- MRI --, therefor.

In Column 6, Line 50, delete "MM" and insert -- MRI --, therefor.

Signed and Sealed this  
Twenty-fifth Day of December, 2012

David J. Kappos  
*Director of the United States Patent and Trademark Office*